(12) United States Patent
Chou et al.

(10) Patent No.: US 12,439,645 B2
(45) Date of Patent: Oct. 7, 2025

(54) HIGH ELECTRON MOBILITY TRANSISTOR DEVICE AND MANUFACTURING METHOD THEREOF

(71) Applicant: Powerchip Semiconductor Manufacturing Corporation, Hsinchu (TW)

(72) Inventors: Jih-Wen Chou, Hsinchu (TW); Hsin-Hong Chen, Hsinchu (TW); Yu-Jen Huang, Hsinchu (TW); Robin Christine Hwang, Taipei (TW); Po-Hsien Yeh, Hsinchu County (TW); Chih-Hung Lu, Taichung (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 524 days.

(21) Appl. No.: 17/942,189

(22) Filed: Sep. 12, 2022

(65) Prior Publication Data

US 2023/0299169 A1  Sep. 21, 2023

(30) Foreign Application Priority Data

Mar. 18, 2022  (TW) .................................. 111109980

(51) Int. Cl.
*H10D 30/67* (2025.01)
*H01L 21/285* (2006.01)
(Continued)

(52) U.S. Cl.
CPC ..... *H10D 30/675* (2025.01); *H01L 21/28581* (2013.01); *H01L 21/28587* (2013.01);
(Continued)

(58) Field of Classification Search
CPC .. H10D 30/675; H10D 30/015; H10D 30/475; H10D 30/6738; H10D 62/824;
(Continued)

(56) References Cited

U.S. PATENT DOCUMENTS

| 9,412,856 B2 * | 8/2016 | Fujimoto et al. .... H10D 62/343 |
| 2010/0258843 A1 * | 10/2010 | Lidow et al. ........ H10D 30/475 |
| | | 257/192 |
| 2021/0175343 A1 * | 6/2021 | Chen et al. ........ H10D 30/4732 |

FOREIGN PATENT DOCUMENTS

| TW | I724694 | 4/2021 |
| TW | I740554 | 9/2021 |

OTHER PUBLICATIONS

TWI724694B translation (Year: 2025).*
(Continued)

*Primary Examiner* — Christine S. Kim
*Assistant Examiner* — Nathalie R Fayette
(74) *Attorney, Agent, or Firm* — JCIPRNET

(57) ABSTRACT

A high electron mobility transistor device including a channel layer, a first barrier layer, a gate structure, and a spacer is provided. The first barrier layer is disposed on the channel layer. The gate structure is disposed on the first barrier layer. The gate structure includes a first P-type gallium nitride layer, a second barrier layer, and a second P-type gallium nitride layer. The first P-type gallium nitride layer is disposed on the first barrier layer. The second barrier layer is disposed on the first P-type gallium nitride layer. The second P-type gallium nitride layer is disposed on the second barrier layer. A width of the second P-type gallium nitride layer is smaller than a width of the first P-type gallium nitride layer. The spacer is disposed on a sidewall of the second P-type gallium nitride layer.

20 Claims, 9 Drawing Sheets

(51) Int. Cl.
  *H01L 23/31*   (2006.01)
  *H10D 30/01*   (2025.01)
  *H10D 30/47*   (2025.01)
  *H10D 62/824*  (2025.01)
  *H10D 62/85*   (2025.01)
  *H10D 64/27*   (2025.01)
  *H10D 64/64*   (2025.01)

(52) U.S. Cl.
  CPC ....... *H01L 23/3192* (2013.01); *H10D 30/015* (2025.01); *H10D 30/475* (2025.01); *H10D 30/6738* (2025.01); *H10D 62/824* (2025.01); *H10D 62/85* (2025.01); *H10D 62/8503* (2025.01); *H10D 64/411* (2025.01); *H10D 64/64* (2025.01)

(58) Field of Classification Search
  CPC .. H10D 62/85; H10D 62/8503; H10D 64/411; H10D 64/64; H10D 64/602; H10D 62/343; H10D 62/103; H10D 62/124; H10D 64/514; H10D 30/47; H01L 21/28581; H01L 21/28587; H01L 23/3192; H01L 23/3171
  See application file for complete search history.

(56) References Cited

OTHER PUBLICATIONS

Translation for TWI740554 (Year: 2025).*
Gerrit Lükens et al., "Self-Aligned Process for Selectively Etched p-GaN-Gated AlGaN/GaN-on-Si HFETs", IEEE Transactions On Electron Devices, vol. 65, Issue 9, Sep. 2018, pp. 3732-3738.
"Office Action of Taiwan Counterpart Application", issued on Feb. 9, 2023, p. 1-p. 6.

* cited by examiner

US 12,439,645 B2

1

HIGH ELECTRON MOBILITY TRANSISTOR DEVICE AND MANUFACTURING METHOD THEREOF

CROSS-REFERENCE TO RELATED APPLICATION

This application claims the priority benefit of Taiwan application serial no. 111109980, filed on Mar. 18, 2022. The entirety of the above-mentioned patent application is hereby incorporated by reference herein and made a part of this specification.

BACKGROUND OF THE INVENTION

Field of the Invention

The invention relates to a semiconductor device and a manufacturing method thereof, and particularly relates to a high electron mobility transistor (HEMT) device and a manufacturing method thereof.

Description of Related Art

The HEMT is a field effect transistor and can have high breakdown voltage and high reliability. However, a large electric field is often generated at the gate edge of the HEMT, which reduces the breakdown voltage of the HEMT and increases the leakage current of the HEMT, thereby reducing the reliability of the HEMT.

SUMMARY OF THE INVENTION

The invention provides a HEMT device and a manufacturing method thereof, which can effectively improve the reliability of the HEMT device.

The invention provides a HEMT device, which includes a channel layer, a first barrier layer, a gate structure, and a spacer. The first barrier layer is disposed on the channel layer. The gate structure is disposed on the first barrier layer. The gate structure includes a first P-type gallium nitride (P-type GaN (pGaN)) layer, a second barrier layer, and a second P-type gallium nitride layer. The first P-type gallium nitride layer is disposed on the first barrier layer. The second barrier layer is disposed on the first P-type gallium nitride layer. The second P-type gallium nitride layer is disposed on the second barrier layer. The width of the second P-type gallium nitride layer is smaller than the width of the first P-type gallium nitride layer. The spacer is disposed on the sidewall of the second P-type gallium nitride layer.

According to an embodiment of the invention, in the HEMT device, the material of the channel layer is, for example, gallium nitride (GaN).

According to an embodiment of the invention, in the HEMT device, the material of the first barrier layer is, for example, aluminum gallium nitride (AlGaN).

According to an embodiment of the invention, in the HEMT device, the aluminum content in the aluminum gallium nitride may be 16 atomic % to 50 atomic %.

According to an embodiment of the invention, in the HEMT device, the thickness of the second P-type gallium nitride layer may be greater than the thickness of the first P-type gallium nitride layer.

According to an embodiment of the invention, in the HEMT device, the material of the second barrier layer is, for example, aluminum gallium nitride, aluminum nitride (AlN), or aluminum oxide ($Al_2O_3$).

2

According to an embodiment of the invention, in the HEMT device, the aluminum content in the aluminum gallium nitride may be 16 atomic % to 50 atomic %.

According to an embodiment of the invention, in the HEMT device, the spacer may be further disposed on the second barrier layer.

According to an embodiment of the invention, in the HEMT device, the gate structure may further include a work function layer. The work function layer is disposed on the second P-type gallium nitride layer. The spacer may be further disposed on the sidewall of the work function layer.

According to an embodiment of the invention, in the HEMT device, the width of the work function layer may be smaller than the width of the second P-type gallium nitride layer.

According to an embodiment of the invention, in the HEMT device, the spacer may be further disposed on a portion of the top surface of the second P-type gallium nitride layer.

According to an embodiment of the invention, the HEMT device may further include a hard mask layer. The hard mask layer is disposed on the work function layer. The spacer may be further disposed on the sidewall of the hard mask layer.

According to an embodiment of the invention, in the HEMT device, the cross-sectional shape of the gate structure may be an inverse-T shape.

According to an embodiment of the invention, in the HEMT device, the material of the spacer is, for example, silicon oxide, silicon nitride, or a combination thereof.

According to an embodiment of the invention, the HEMT device may further include a first passivation layer and a second passivation layer. The first passivation layer is disposed between the spacer and the second P-type gallium nitride layer and between the spacer and the second barrier layer. The second passivation layer is disposed on the top surface of the second P-type gallium nitride layer, the sidewall of the spacer, the sidewall of the second barrier layer, the sidewall of the first P-type gallium nitride layer, and the top surface of the first barrier layer.

According to an embodiment of the invention, the HEMT device may further include a contact, a source electrode, and a drain electrode. The contact is electrically connected to the gate structure. The source electrode and drain electrode are disposed on two sides of the gate structure.

The invention provides a manufacturing method of a HEMT device, which includes the following steps. A channel layer is provided. The first barrier layer is formed on the channel layer. A gate structure is formed on the first barrier layer. The gate structure includes a first P-type gallium nitride layer, a second barrier layer, and a second P-type gallium nitride layer. The first P-type gallium nitride layer is disposed on the first barrier layer. The second barrier layer is disposed on the first P-type gallium nitride layer. The second P-type gallium nitride layer is disposed on the second barrier layer. The width of the second P-type gallium nitride layer is smaller than the width of the first P-type gallium nitride layer. A spacer is formed on the sidewall of the second P-type gallium nitride layer.

According to an embodiment of the invention, in the manufacturing method of the HEMT device, the gate structure may further include a work function layer. The work function layer is disposed on the second P-type gallium nitride layer. The manufacturing method of the HEMT device may further include the following step. A hard mask layer is formed on the work function layer.

According to an embodiment of the invention, in the manufacturing method of the HEMT device, the method of forming the gate structure and the hard mask layer may include the following steps. A first P-type gallium nitride material layer, a barrier material layer, a second P-type gallium nitride material layer, a work function material layer, and a hard mask material layer are sequentially formed on the first barrier layer. The hard mask material layer, the work function material layer, and the second P-type gallium nitride material layer are patterned to form the hard mask layer, the work function layer, and the second P-type gallium nitride layer. The spacer is formed on the sidewall of the hard mask layer, the sidewall of the work function layer, and the sidewall of the second P-type gallium nitride layer. A portion of the barrier material layer and a portion of the first P-type gallium nitride material layer are removed to form the second barrier layer and the first P-type gallium nitride layer by using the hard mask layer and the spacer as a mask.

According to an embodiment of the invention, the manufacturing method of the HEMT device may further include the following step. Before forming the spacer, a lateral etching process is performed on the work function layer and the hard mask layer to reduce the width of the work function layer and the width of the hard mask layer.

Based on the above description, in the HEMT device and the manufacturing method thereof according to the invention, the spacer is disposed on the sidewall of the second P-type gallium nitride layer, thereby reducing the electric field at the edge of the gate structure. Therefore, the breakdown voltage of the HEMT device can be increased and the leakage current of the HEMT device can be reduced, thereby effectively improving the reliability of the HEMT device. In addition, since the width of the second P-type gallium nitride layer is smaller than the width of the first P-type gallium nitride layer, the edge portion of the gate structure can have a smaller thickness. In this way, the concentration of two-dimensional electron gas (2DEG) of the HEMT device can be increased, thereby improving the turn-on current and electrical performance of the HEMT device. Furthermore, when the gate structure includes the work function layer, the work function layer can be used to adjust the interface between the work function layer and the second P-type gallium nitride layer to form an ohmic contact or a Schottky contact, so as to be applied to the needs of different products.

In order to make the aforementioned and other objects, features and advantages of the invention comprehensible, several exemplary embodiments accompanied with FIGURES are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

FIG. 1A to FIG. 1I are cross-sectional views illustrating a manufacturing process of a HEMT device according to some embodiments of the invention.

Figure 1A:
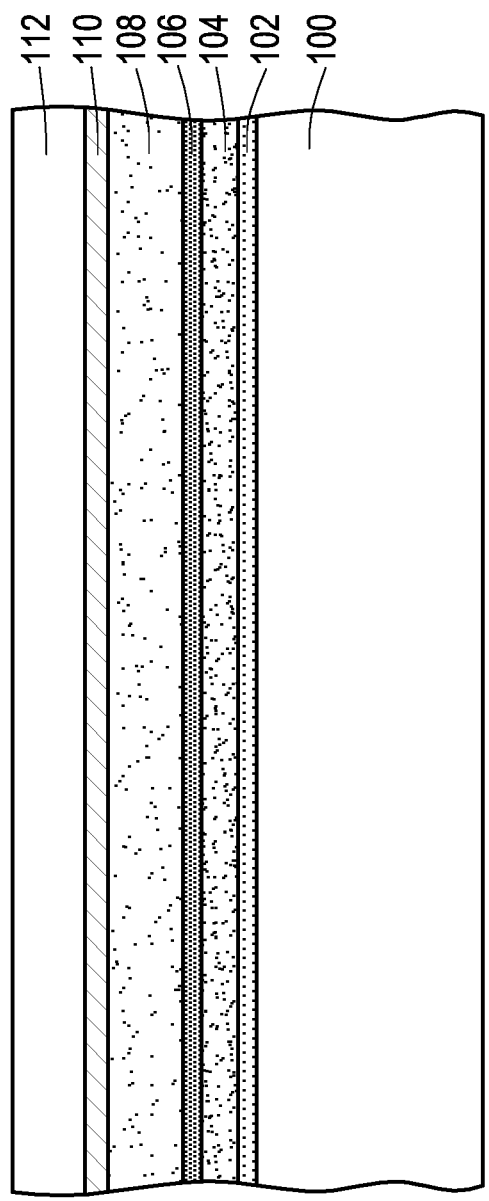
FIG. 1A to FIG. 1I are cross-sectional views illustrating a manufacturing process of a HEMT device according to some embodiments of the invention.

Referring to FIG. 1A, a channel layer 100 is provided. In some embodiments, channel layer 100 may be provided on a substrate (not shown). The substrate may be a semiconductor substrate such as a silicon substrate. In some embodiments, there may be a buffer layer (not shown) between the channel layer 100 and the substrate. The material of the buffer layer is, for example, aluminum nitride, aluminum gallium nitride, carbon-doped gallium nitride (C-doped GaN), or a combination thereof. The material of the channel layer 100 is, for example, gallium nitride. The method of forming the channel layer 100 is, for example, an epitaxial growth method.

A barrier layer 102 is formed on the channel layer 100. The material of the barrier layer 102 is, for example, aluminum gallium nitride. The method of forming the barrier layer 102 is, for example, an epitaxial growth method.

A P-type gallium nitride material layer 104, a barrier material layer 106, a P-type gallium nitride material layer 108, a work function material layer 110, and a hard mask material layer 112 may be sequentially formed on the barrier layer 102. The material of the barrier material layer 106 is, for example, aluminum gallium nitride, aluminum nitride, or aluminum oxide. When the interface between the work function material layer 110 and the P-type gallium nitride material layer 108 forms an ohmic contact, the material of the work function material layer 110 may be tantalum (Ta), aluminum (Al), or titanium (Ti). In addition, when the interface between the work function material layer 110 and the P-type gallium nitride material layer 108 forms a Schottky contact, the material of the work function material layer 110 may be titanium nitride (TiN), tantalum nitride (TaN), tungsten (W), nickel (Ni), or gold (Au). The material of the hard mask material layer 112 is, for example, silicon nitride. The thickness of the p-type gallium nitride material layer 108 may be greater than the thickness of the p-type gallium nitride material layer 104.

In some embodiments, the P-type gallium nitride material layer 104, the barrier material layer 106, and the P-type gallium nitride material layer 108 may be formed by an epitaxial growth method, respectively. The method of forming the work function material layer 110 is, for example, an atomic layer deposition (ALD) method or a physical vapor deposition (PVD) method. The method of forming the hard mask material layer 112 is, for example, a chemical vapor deposition (CVD) method. In other embodiments, the work function material layer 110 and/or the hard mask material layer 112 may be omitted according to requirements.

Figure 1B:
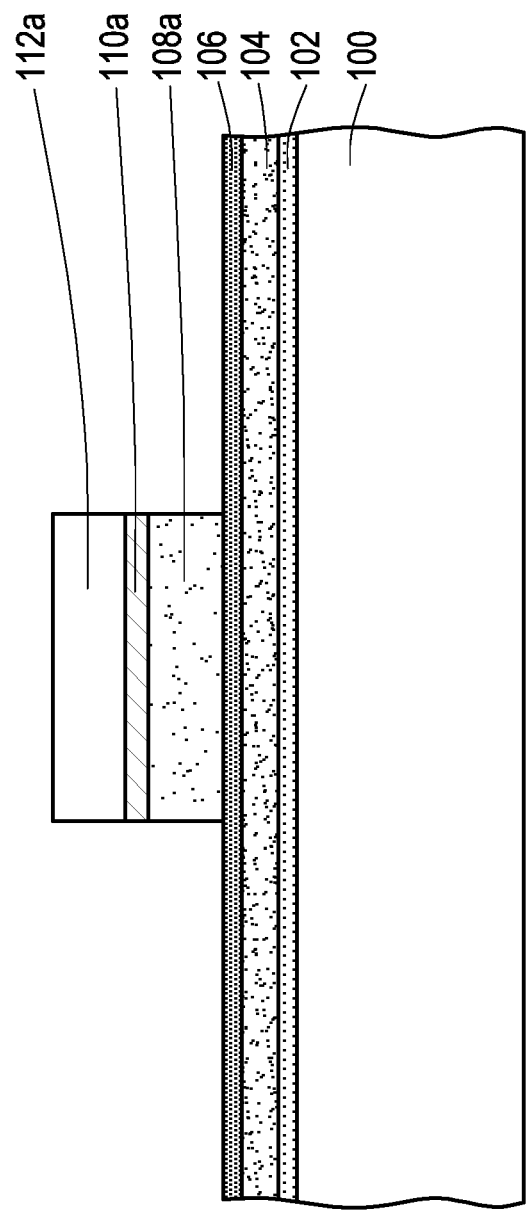

Referring to FIG. 1B, the hard mask material layer 112, the work function material layer 110, and the P-type gallium nitride material layer 108 may be patterned to form a hard mask layer 112a, a work function layer 110a, and a P-type gallium nitride layer 108a. Therefore, the work function layer 110a may be formed on the P-type gallium nitride layer 108a, and the hard mask layer 112a may be formed on the work function layer 110a. In some embodiments, the hard mask material layer 112, the work function material layer 110, and the P-type gallium nitride material layer 108 may be patterned by a lithography process and an etching process (e.g., dry etching process).

Figure 1C:
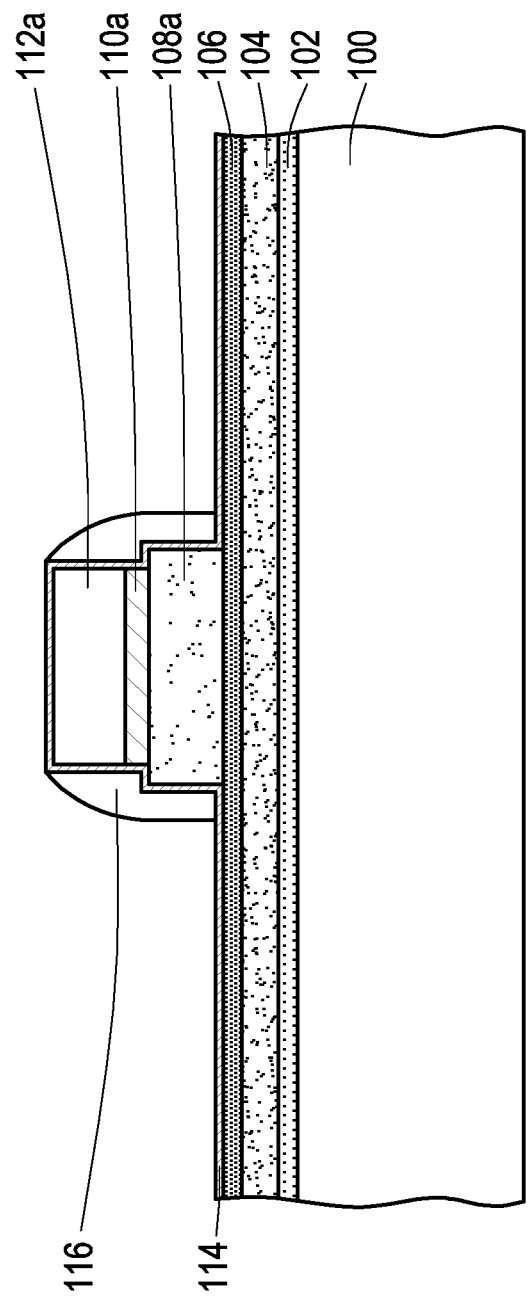

Referring to FIG. 1C, a lateral etching process may be performed on the work function layer 110a and the hard mask layer 112a to reduce the width of the work function layer 110a and the width of the hard mask layer 112a. The lateral etching process is, for example, a dry etching process.

A passivation material layer 114 may be formed on the barrier material layer 106, the P-type gallium nitride layer 108a, the work function layer 110a, and the hard mask layer 112a. In some embodiments, the passivation material layer 114 may be conformally formed on the barrier material layer 106, the P-type gallium nitride layer 108a, the work function layer 110a, and the hard mask layer 112a. The material of the passivation material layer 114 is, for example, aluminum oxide or aluminum nitride. The method of forming the passivation material layer 114 is, for example, an atomic layer deposition method.

A spacer 116 may be formed on the sidewall of the hard mask layer 112a, the sidewall of the work function layer 110a, and the sidewall of the P-type gallium nitride layer 108a. In the present embodiment, the spacer 116 may be formed on the passivation material layer 114. The spacer 116 may be a single-layer structure or a multilayer structure. The material of the spacer 116 is, for example, silicon oxide, silicon nitride, or a combination thereof. In some embodiments, the method of forming the spacer 116 may include the following steps, but the invention is not limited thereto. A spacer material layer (not shown) may be conformally formed on the passivation material layer 114. A dry etching process may be performed on the spacer material layer to form the spacer 116.

Figure 1D:
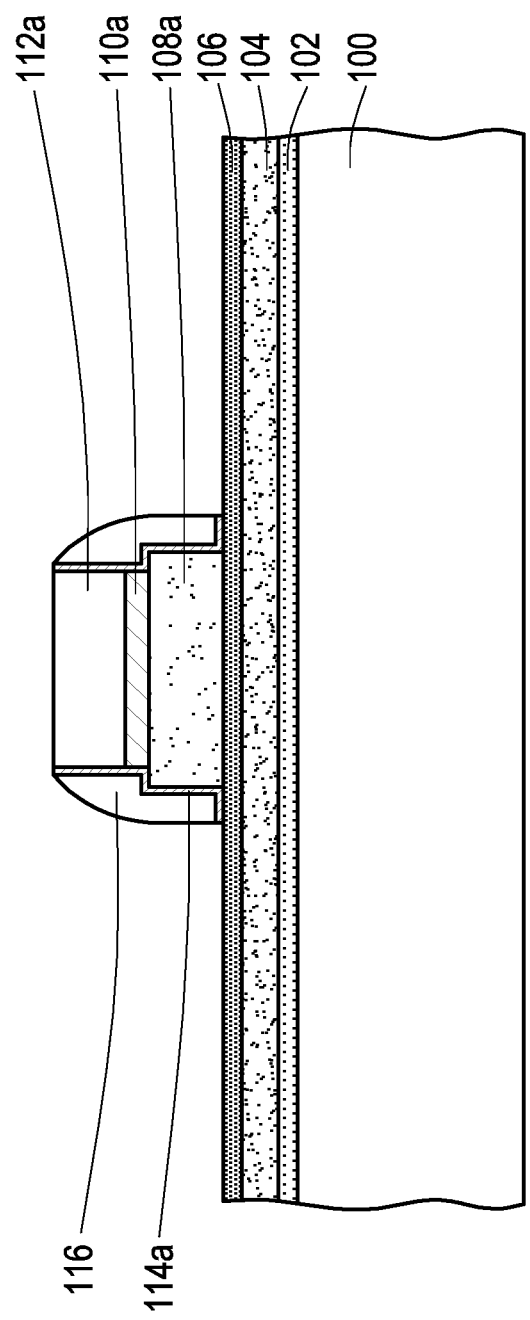

Referring to FIG. 1D, a portion of the passivation material layer 114 may be removed to form a passivation layer 114a, and the hard mask layer 112a and the barrier material layer 106 may be exposed. A method of removing a portion of the passivation material layer 114 is, for example, a dry etching method.

Figure 1E:
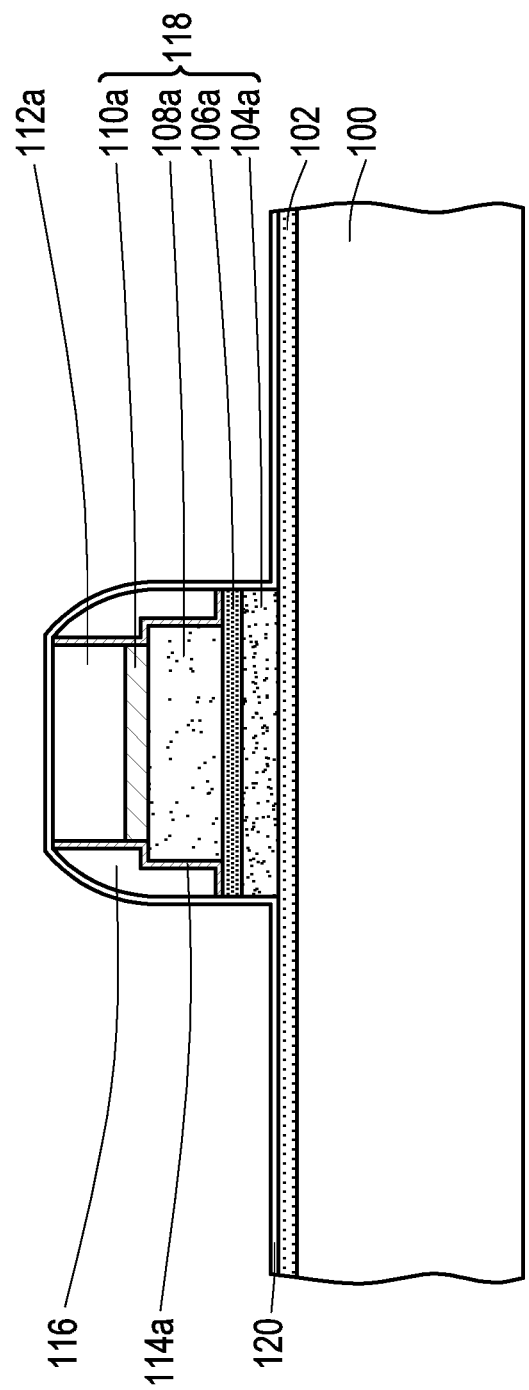

Referring to FIG. 1E, a portion of the barrier material layer 106 and a portion of the p-type gallium nitride material layer 104 are removed to form the barrier layer 106a and the p-type gallium nitride layer 104a by using the hard mask layer 112a and the spacer 116 as a mask, and the barrier layer 102 may be exposed. Moreover, the width of the barrier layer 106a and the width of the P-type gallium nitride layer 104a may be adjusted by the width of the spacer 116. A method of removing a portion of the barrier material layer 106 and a portion of the P-type gallium nitride material layer 104 is, for example, a dry etching method or an atomic layer etching (ALE) method.

Therefore, a gate structure 118 may be formed on the barrier layer 102. The gate structure 118 includes the P-type gallium nitride layer 104a, the barrier layer 106a, and the P-type gallium nitride layer 108a. The P-type gallium nitride layer 104a is disposed on the barrier layer 102. The barrier layer 106a is disposed on the P-type gallium nitride layer 104a. The p-type gallium nitride layer 108a is disposed on the barrier layer 106a. Furthermore, the gate structure 118 may further include the work function layer 110a. The work function layer 110a is disposed on the P-type gallium nitride layer 108a.

A passivation layer 120 may be formed on the top surface of the P-type gallium nitride layer 108a, the sidewall of the spacer 116, the sidewall of the barrier layer 106a, the sidewall of the P-type gallium nitride layer 104a, and the top surface of the barrier layer 102. In the present embodiment, the passivation layer 120 may be formed on the hard mask layer 112a over the top surface of the P-type gallium nitride layer 108a. In some embodiments, the passivation layer 120 may be conformally formed on the top surface of the hard mask layer 112a, the sidewall of the spacer 116, the sidewall of the barrier layer 106a, the sidewall of the P-type gallium nitride layer 104a, and the top surface of the barrier layer 102. The material of the passivation layer 120 is, for example, aluminum oxide or aluminum nitride. The method of forming the passivation layer 120 is, for example, an atomic layer deposition method.

Figure 1F:
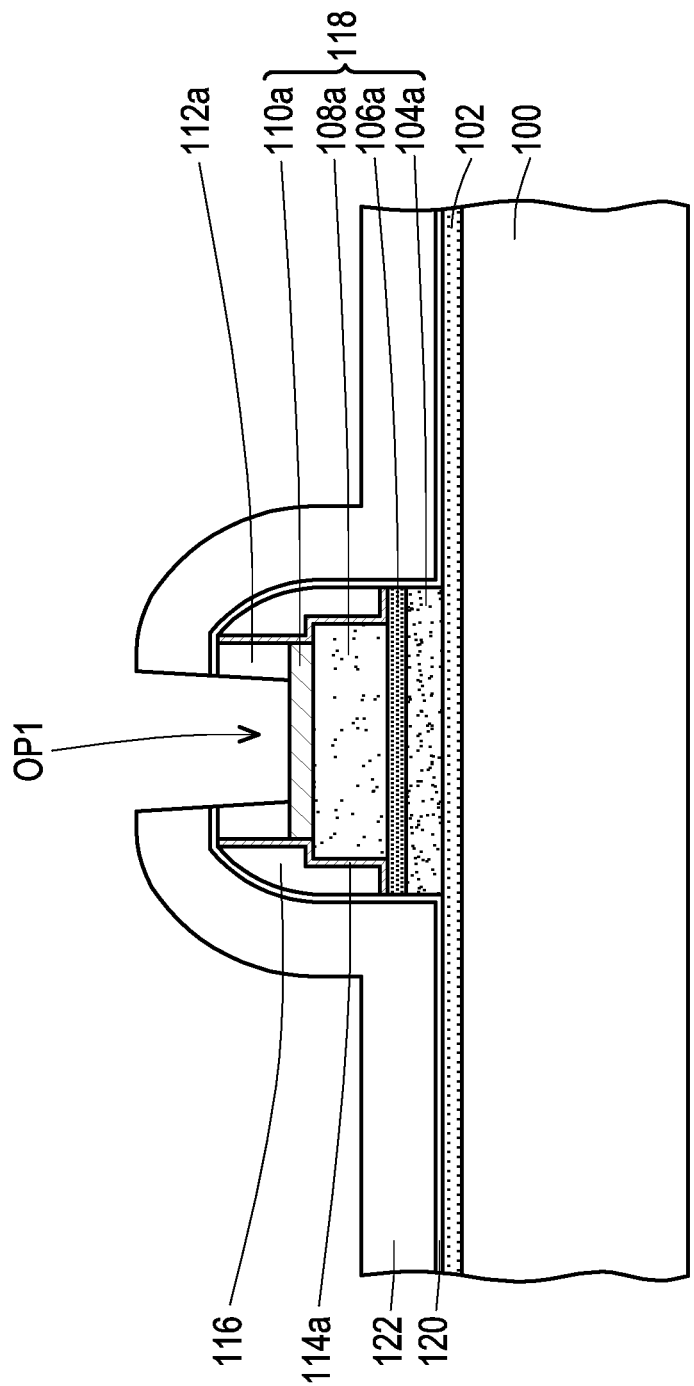

Referring to FIG. 1F, a dielectric layer 122 may be formed on the passivation layer 120. The material of the dielectric layer 122 is, for example, silicon oxide. The method of forming the dielectric layer 122 is, for example, a chemical vapor deposition method.

An opening OP1 may be formed in the dielectric layer 122, the passivation layer 120, and the hard mask layer 112a. The opening OP1 may expose the work function layer 110a. In some embodiments, the opening OP1 may be formed by removing a portion of the dielectric layer 122, a portion of the passivation layer 120, and a portion of the hard mask layer 112a by a lithography process and an etching process (e.g., dry etching process).

Figure 1G:
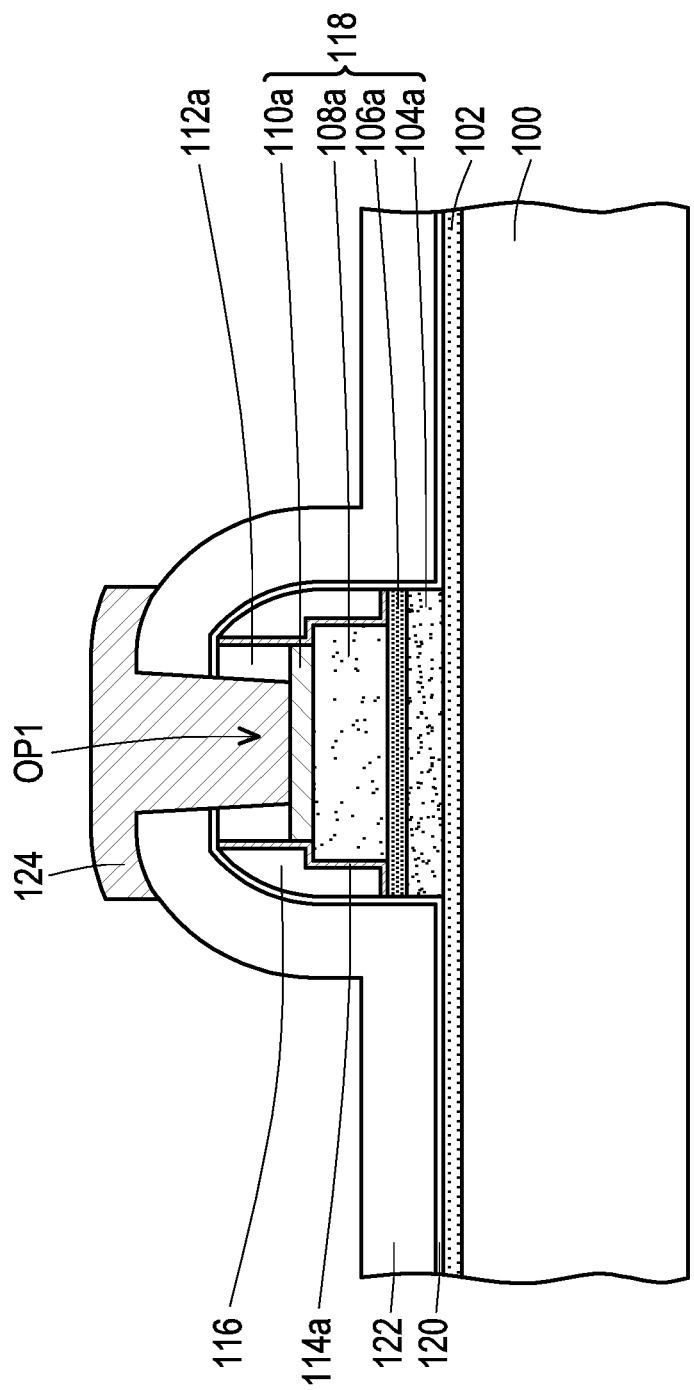

Referring to FIG. 1G, a contact 124 may be formed in the opening OP1. The contact 124 is electrically connected to the gate structure 118. In some embodiments, the contact 124 may be electrically connected to the work function layer 110a, and the contact 124 may be electrically connected to the P-type gallium nitride layer 108a by the work function layer 110a. The material of the contact 124 is, for example, titanium, titanium nitride, aluminum copper alloy (AlCu), or a combination thereof. In some embodiments, the contact 124 may be formed by a deposition process, a lithography process, and an etching process.

Figure 1H:
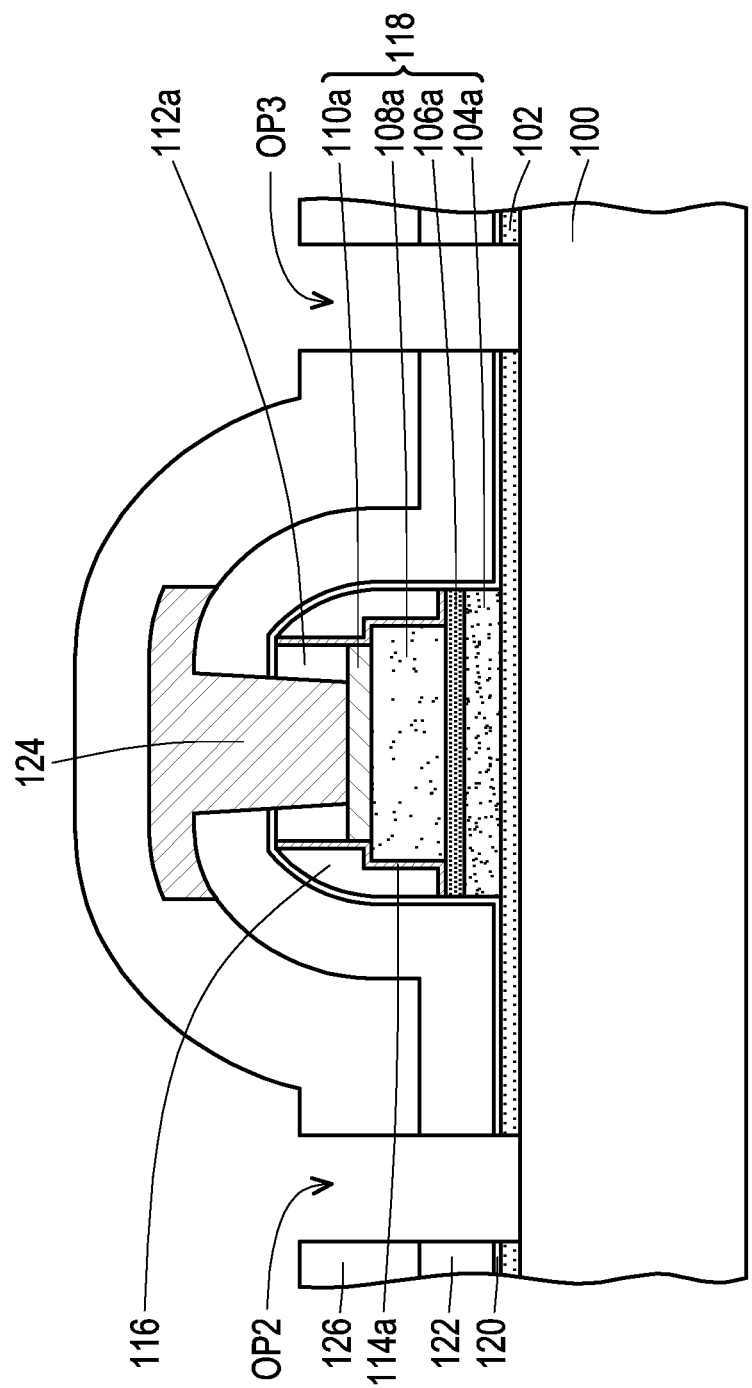

Referring to FIG. 1H, a dielectric layer 126 may be formed on the dielectric layer 122 and the contact 124. The material of the dielectric layer 126 is, for example, silicon oxide. The method of forming the dielectric layer 126 is, for example, a chemical vapor deposition method.

An opening OP2 and an opening OP3 may be formed in the dielectric layer 126. The opening OP2 and the opening OP3 may expose a portion of the channel layer 100. In some embodiments, a portion of the dielectric layer 126, a portion of the dielectric layer 122, a portion of the passivation layer 120, and a portion of the barrier layer 102 may be removed by a lithography process and an etching process (e.g., dry etching process) to form the opening OP2 and opening OP3.

Figure 1I:
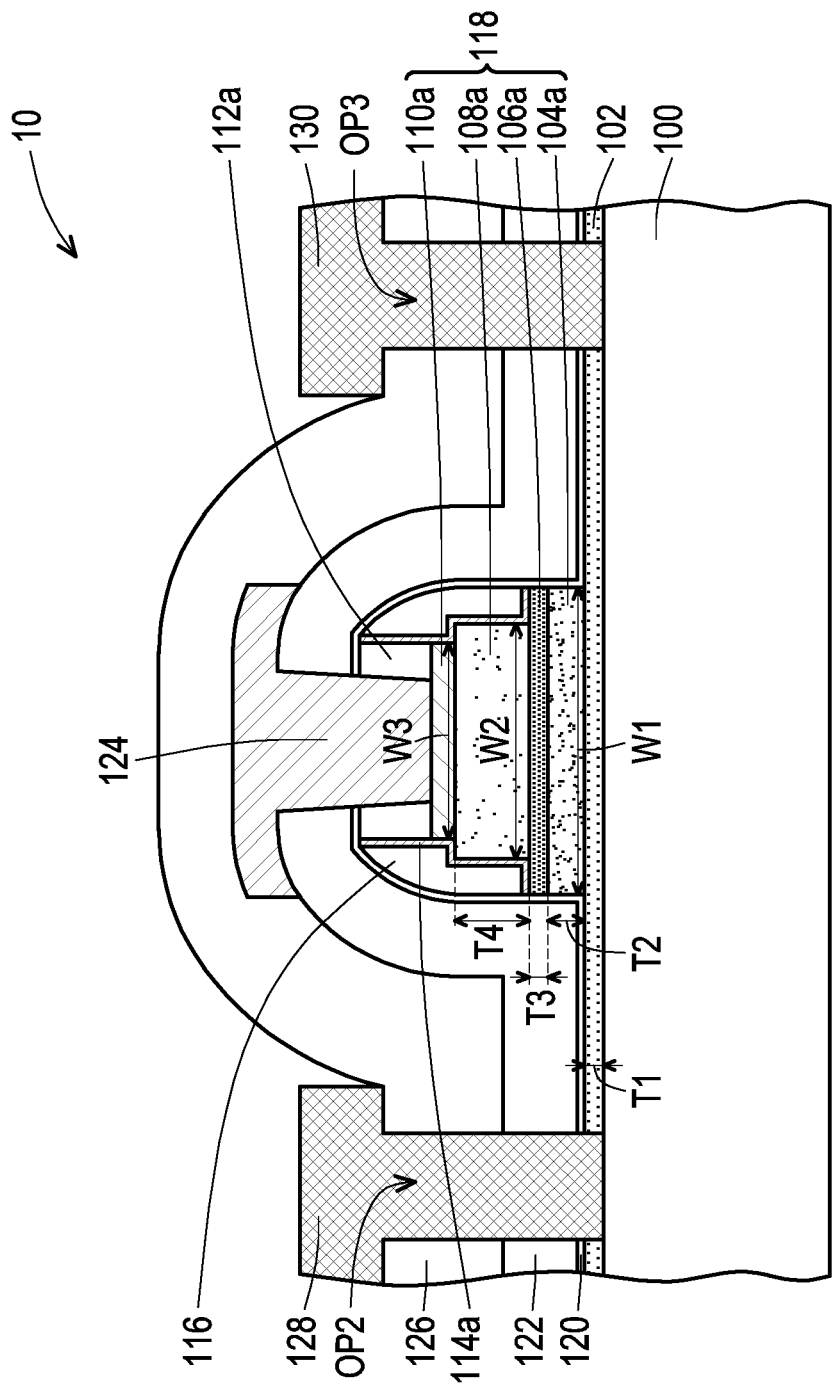

Referring to FIG. 1I, a source electrode 128 and a drain electrode 130 may be formed in the opening OP2 and the opening OP3, respectively. The material of the source electrode 128 and the drain electrode 130 is, for example, titanium, titanium nitride, aluminum copper alloy, or a combination thereof. In some embodiments, the source electrode 128 and the drain electrode 130 may be formed by a deposition process, a lithography process, and an etching process.

Hereinafter, the HEMT device 10 of the above embodiment is described with reference to FIG. 1I. Moreover, although the method for forming the HEMT device 10 is described by taking the above method as an example, the invention is not limited thereto.

Referring to FIG. 1I, the HEMT device 10 includes a channel layer 100, a barrier layer 102, a gate structure 118, and a spacer 116. The material of the channel layer 100 is, for example, gallium nitride.

The barrier layer 102 is disposed on the channel layer 100. The material of the barrier layer 102 is, for example, aluminum gallium nitride. In some embodiments, the aluminum content in the aluminum gallium nitride may be 16 atomic % to 50 atomic %. The aluminum content in the aluminum gallium nitride can be used to adjust the concentration of the 2DEG. In some embodiments, when the material of the barrier layer 102 is aluminum gallium nitride, and the aluminum content in the aluminum gallium nitride is 16 atomic % to 50 atomic %, the concentration of the 2DEG of the HEMT device 10 can be increased, thereby improving the turn-on current and electrical performance of the HEMT device 10. In some embodiments, the thickness T1 of the barrier layer 102 may be 10 nm to 30 nm.

The gate structure 118 is disposed on the barrier layer 102. The gate structure 118 includes a P-type gallium nitride layer 104a, a barrier layer 106a, and a P-type gallium nitride layer 108a. In some embodiments, the cross-sectional shape of the gate structure 118 may be an inverse-T shape. The P-type gallium nitride layer 104a is disposed on the barrier layer 102. In some embodiments, the thickness T2 of the P-type gallium nitride layer 104a may be 20 nm to 35 nm.

The barrier layer 106a is disposed on the P-type gallium nitride layer 104a. The material of the barrier layer 106a is, for example, aluminum gallium nitride, aluminum nitride, or aluminum oxide. In some embodiments, the aluminum content in the aluminum gallium nitride may be 16 atomic % to 50 atomic %. The aluminum content in the aluminum gallium nitride can be used to adjust the concentration of the 2DEG. In some embodiments, when the material of the barrier layer 106a is aluminum gallium nitride, and the aluminum content in the aluminum gallium nitride is 16 atomic % to 50 atomic %, the concentration of the 2DEG of the HEMT device 10 can be increased, thereby improving the turn-on current and electrical performance of the HEMT device 10. In some embodiments, the thickness T3 of the barrier layer 106a may be 2 nm to 10 nm.

The P-type gallium nitride layer 108a is disposed on the barrier layer 106a. The width W2 of the P-type gallium nitride layer 108a is smaller than the width W1 of the P-type gallium nitride layer 104a, so the edge portion of the gate structure 118 can have a smaller thickness. In this way, the concentration of the 2DEG of the HEMT device 10 can be increased, thereby improving the turn-on current and electrical performance of the HEMT device 10.

In some embodiments, the thickness T4 of the P-type gallium nitride layer 108a may be greater than the thickness T2 of the P-type gallium nitride layer 104a. Therefore, the concentration of the 2DEG under the spacer 116 can be increased, thereby improving the turn-on current and electrical performance of the HEMT device 10. In some embodiments, the thickness T4 of the P-type gallium nitride layer 108a may be 40 nm to 80 nm.

The gate structure 118 may further include a work function layer 110a. The work function layer 110a is disposed on the P-type gallium nitride layer 108a. In some embodiments, the width W3 of the work function layer 110a may be smaller than the width W2 of the P-type gallium nitride layer 108a. The material of the work function layer 110a is, for example, titanium nitride, tantalum nitride, or tungsten.

The spacer 116 is disposed on the sidewall of the P-type gallium nitride layer 108a, thereby reducing the electric field at the edge of the gate structure 118. Therefore, the breakdown voltage of the HEMT device 10 can be increased and the leakage current of the HEMT device 10 can be reduced, thereby effectively improving the reliability of the HEMT device 10. In some embodiments, the spacer 116 may be further disposed on the barrier layer 106a. For example, the spacer 116 may be disposed on a portion of the top surface of the barrier layer 106a. In some embodiments, the spacer 116 may be further disposed on a portion of the top surface of the P-type gallium nitride layer 108a. In some embodiments, the spacer 116 may be further disposed on the sidewall of the work function layer 110a. The spacer 116 may be a single-layer structure or a multilayer structure. The material of the spacer 116 is, for example, silicon oxide, silicon nitride, or a combination thereof.

The HEMT device 10 may further include at least one of a hard mask layer 112a, a passivation layer 114a, a passivation layer 120, a dielectric layer 122, a contact 124, a dielectric layer 126, a source electrode 128, and a drain electrode 130. The hard mask layer 112a is disposed on the work function layer 110a. In some embodiments, the spacer 116 may be further disposed on the sidewall of the hard mask layer 112a. The material of the hard mask layer 112a is, for example, silicon nitride.

The passivation layer 114a is disposed between the spacer 116 and the P-type gallium nitride layer 108a and between the spacer 116 and the barrier layer 106a. The passivation layer 114a can be used to reduce the electric field and can be used to repair the surface of the P-type gallium nitride layer 108a, thereby helping to further reduce leakage current. In some embodiments, the passivation layer 114a may be further disposed between the spacer 116 and the work function layer 110a and between the spacer 116 and the hard mask layer 112a. The material of the passivation layer 114a is, for example, aluminum oxide or aluminum nitride.

The passivation layer 120 is disposed on the top surface of the P-type gallium nitride layer 108a, the sidewall of the spacer 116, the sidewall of the barrier layer 106a, the sidewall of the P-type gallium nitride layer 104a, and the top surface of the barrier layer 102. In the present embodiment, the passivation layer 120 may be disposed on the hard mask layer 112a over the top surface of the P-type gallium nitride layer 108a. The material of the passivation layer 120 is, for example, aluminum oxide or aluminum nitride.

The dielectric layer 122 is disposed on the passivation layer 120. The material of the dielectric layer 122 is, for example, silicon oxide. The contact 124 is electrically connected to the gate structure 118. In some embodiments, the contact 124 may be electrically connected to the work function layer 110a, and the contact 124 may be electrically connected to the P-type gallium nitride layer 108a by the work function layer 110a. In some embodiments, the contact 124 may pass through the dielectric layer 122, the passivation layer 120, and the hard mask layer 112a to be electrically connected to the work function layer 110a. In some embodiments, a portion of the contact 124 may be disposed on the dielectric layer 122. The material of the contact 124 is, for example, titanium, titanium nitride, aluminum copper alloy, or a combination thereof.

The dielectric layer 126 is disposed on the dielectric layer 122 and the contact 124. The source electrode 128 and the drain electrode 130 are disposed on two sides of the gate structure 118. In some embodiments, the source electrode 128 and the drain electrode 130 may be connected to channel layer 100, respectively. In some embodiments, the source electrode 128 and the drain electrode 130 may respectively pass through the dielectric layer 126, the dielectric layer 122, the passivation layer 120, and the barrier layer 102 to be connected to channel layer 100. In addition, a portion of the source electrode 128 and a portion of the drain electrode 130 may be disposed on the dielectric layer 126. The material of the source electrode 128 and the drain electrode 130 is, for example, titanium, titanium nitride, aluminum copper alloy, or a combination thereof.

Based on the above embodiments, in the HEMT device 10 and the manufacturing method thereof, the spacer 116 is disposed on the sidewall of the P-type gallium nitride layer 108a, thereby reducing the electric field at the edge of the gate structure 118. Therefore, the breakdown voltage of the HEMT device 10 can be increased and the leakage current of the HEMT device 10 can be reduced, thereby effectively improving the reliability of the HEMT device 10. In addition, since the width W2 of the P-type gallium nitride layer 108a is smaller than the width W1 of the P-type gallium nitride layer 104a, the edge portion of the gate structure 118 can have a smaller thickness. In this way, the concentration of the 2DEG of the HEMT device 10 can be increased, thereby improving the turn-on current and electrical performance of the HEMT device 10. Furthermore, when the gate structure 118 includes the work function layer 110a, the work function layer 110a can be used to adjust the interface between the work function layer 110a and the P-type gallium nitride layer 108a to form an ohmic contact or a Schottky contact, so as to be applied to the needs of different products.

In summary, in the HEMT device and the manufacturing method thereof of the aforementioned embodiments, the electric field at the edge of the gate structure can be reduced by the spacer. Therefore, the breakdown voltage of the HEMT device can be increased and the leakage current of the HEMT device can be reduced, thereby effectively improving the reliability of the HEMT device. In addition, since the edge portion of the gate structure can have a smaller thickness, the concentration of the 2DEG of the HEMT device can be increased, thereby improving the turn-on current and electrical performance of the HEMT device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A high electron mobility transistor (HEMT) device, comprising:
   a channel layer;
   a first barrier layer disposed on the channel layer;
   a gate structure disposed on the first barrier layer and comprising:
     a first P-type gallium nitride layer disposed on the first barrier layer;
     a second barrier layer disposed on the first P-type gallium nitride layer; and
     a second P-type gallium nitride layer disposed on the second barrier layer,
   wherein a width of the second P-type gallium nitride layer is smaller than a width of the first P-type gallium nitride layer; and
   a spacer disposed on a sidewall of the second P-type gallium nitride layer.

2. The HEMT device according to claim 1, wherein a material of the channel layer comprises gallium nitride.

3. The HEMT device according to claim 1, wherein a material of the first barrier layer comprises aluminum gallium nitride.

4. The HEMT device according to claim 3, wherein an aluminum content in the aluminum gallium nitride is 16 atomic % to 50 atomic %.

5. The HEMT device according to claim 1, wherein a thickness of the second P-type gallium nitride layer is greater than a thickness of the first P-type gallium nitride layer.

6. The HEMT device according to claim 1, wherein a material of the second barrier layer comprises aluminum gallium nitride, aluminum nitride, or aluminum oxide.

7. The HEMT device according to claim 6, wherein an aluminum content in the aluminum gallium nitride is 16 atomic % to 50 atomic %.

8. The HEMT device according to claim 1, wherein the spacer is further disposed on the second barrier layer.

9. The HEMT device according to claim 1, wherein the gate structure further comprises:
   a work function layer disposed on the second P-type gallium nitride layer, wherein the spacer is further disposed on a sidewall of the work function layer.

10. The HEMT device according to claim 9, wherein a width of the work function layer is smaller than the width of the second P-type gallium nitride layer.

11. The HEMT device according to claim 10, wherein the spacer is further disposed on a portion of a top surface of the second P-type gallium nitride layer.

12. The HEMT device according to claim 9, further comprising:
    a hard mask layer disposed on the work function layer, wherein the spacer is further disposed on a sidewall of the hard mask layer.

13. The HEMT device according to claim 1, wherein a cross-sectional shape of the gate structure comprises an inverse-T shape.

14. The HEMT device according to claim 1, wherein a material of the spacer comprises silicon oxide, silicon nitride, or a combination thereof.

15. The HEMT device according to claim 1, further comprising:
    a first passivation layer disposed between the spacer and the second P-type gallium nitride layer and between the spacer and the second barrier layer; and
    a second passivation layer disposed on a top surface of the second P-type gallium nitride layer, a sidewall of the spacer, a sidewall of the second barrier layer, a sidewall of the first P-type gallium nitride layer, and a top surface of the first barrier layer.

16. The HEMT device according to claim 1, further comprising:
    a contact electrically connected to the gate structure; and
    a source electrode and a drain electrode disposed on two sides of the gate structure.

17. A manufacturing method of a HEMT device, comprising:
    providing a channel layer;
    forming a first barrier layer on the channel layer;
    forming a gate structure on the first barrier layer, wherein the gate structure comprises:
      a first P-type gallium nitride layer disposed on the first barrier layer;
      a second barrier layer disposed on the first P-type gallium nitride layer; and
      a second P-type gallium nitride layer disposed on the second barrier layer,
    wherein a width of the second P-type gallium nitride layer is smaller than a width of the first P-type gallium nitride layer; and
    forming a spacer on a sidewall of the second P-type gallium nitride layer.

18. The manufacturing method of the HEMT device according to claim 17, wherein
the gate structure further comprises a work function layer, wherein the work function layer is disposed on the second P-type gallium nitride layer, and
the manufacturing method of the HEMT device further comprises:
forming a hard mask layer on the work function layer.

19. The manufacturing method of the HEMT device according to claim 18, wherein a method of forming the gate structure and the hard mask layer comprises:
sequentially forming a first P-type gallium nitride material layer, a barrier material layer, a second P-type gallium nitride material layer, a work function material layer, and a hard mask material layer on the first barrier layer;
patterning the hard mask material layer, the work function material layer, and the second P-type gallium nitride material layer to form the hard mask layer, the work function layer, and the second P-type gallium nitride layer;
forming the spacer on a sidewall of the hard mask layer, a sidewall of the work function layer, and the sidewall of the second P-type gallium nitride layer; and
removing a portion of the barrier material layer and a portion of the first P-type gallium nitride material layer to form the second barrier layer and the first P-type gallium nitride layer by using the hard mask layer and the spacer as a mask.

20. The manufacturing method of the HEMT device according to claim 19, further comprising:
before forming the spacer, performing a lateral etching process on the work function layer and the hard mask layer to reduce a width of the work function layer and a width of the hard mask layer.

* * * * *